United States Patent
Murayama et al.

(10) Patent No.: US 12,272,588 B2
(45) Date of Patent: Apr. 8, 2025

(54) WAFER CLAMPING METHOD AND SEMICONDUCTOR MANUFACTURING APPARATUS

(71) Applicant: NISSIN ION EQUIPMENT CO., LTD., Koka (JP)

(72) Inventors: Takayuki Murayama, Koka (JP); Yuya Hirai, Koka (JP); Weijiang Zhao, Koka (JP)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 0 days.

(21) Appl. No.: 18/758,113

(22) Filed: Jun. 28, 2024

(65) Prior Publication Data

US 2025/0029865 A1    Jan. 23, 2025

(30) Foreign Application Priority Data

Jul. 21, 2023    (JP) ................. 2023-118870

(51) Int. Cl.
*H01L 21/687*    (2006.01)
*H01L 21/683*    (2006.01)

(52) U.S. Cl.
CPC .... *H01L 21/68721* (2013.01); *H01L 21/6831* (2013.01)

(58) Field of Classification Search
None
See application file for complete search history.

(56) References Cited

U.S. PATENT DOCUMENTS

| 8,797,706 B2 | 8/2014 | Lee et al. |
| 8,941,968 B2 | 1/2015 | Justesen et al. |
| 2020/0350189 A1* | 11/2020 | Adachi ............ H01L 21/67751 |

FOREIGN PATENT DOCUMENTS

JP    2015-203140 A    11/2015

* cited by examiner

*Primary Examiner* — Sean Shechtman
(74) *Attorney, Agent, or Firm* — Sughrue Mion, PLLC

(57) ABSTRACT

A semiconductor manufacturing apparatus includes a wafer clamp including a mechanical clamp and an electrostatic chuck, and a controller that controls the wafer clamp to selective clamp a wafer using only the mechanical clamp based on a processing temperature of a wafer.

16 Claims, 9 Drawing Sheets

WAFER CLAMPING METHOD AND SEMICONDUCTOR MANUFACTURING APPARATUS

CROSS-REFERENCE TO RELATED APPLICATION

This Application claims priority from Japanese Patent Application No. 2023-118870, filed on Jul. 21, 2023, in the Japan Patent Office, the contents of which being incorporated by reference herein in its entirety.

BACKGROUND

The present disclosure relates to a wafer clamping method, semiconductor manufacturing apparatus.

Some implantation processes in an ion implanter are performed to a wafer heated to high temperature. For example, it is difficult to recover crystal defects in SiC wafer by annealing after ion implantation, and to avoid adverse effects on device characteristics, ion implantation is performed with the SiC wafer heated to a high temperature.

SUMMARY

According to an aspect of one or more embodiments, there is provided a wafer clamping method used in semiconductor manufacturing apparatus with a wafer clamp including a mechanical clamp and an electrostatic chuck, the wafer clamping method comprising selectively clamping a wafer using only the mechanical clamp of the wafer clamp, based on a processing temperature of the wafer.

According to another aspect of one or more embodiments, there is provided a semiconductor manufacturing apparatus comprising a wafer clamp including a mechanical clamp and an electrostatic chuck, a controller that controls the wafer clamp to selectively clamp a wafer using only the mechanical clamp, based on a processing temperature of the wafer.

BRIEF DESCRIPTION OF THE DRAWINGS

The above and/or other aspects will become apparent and more readily appreciated from the following description of various embodiments, taken in conjunction with the accompanying drawings, in which.

DETAILED DESCRIPTION

In the ion implantation process, a wafer may be clamped by a mechanical clamp or an electrostatic chuck. Under a high temperature environment, performance of the electrostatic chuck deteriorates and clamping force for the wafer is reduced. A related art technology uses a mechanical clamp in combination with an electrostatic chuck to assist in the reduction of the chucking force in high temperature implantation processes.

The electrostatic chuck may be configured to clamp a backside of the wafer extensively, and an entire wafer may be fixed firmly to some extent. During high-temperature implantation, the wafer is heated by heaters and by ion beam irradiation itself. The heated wafer is subjected to thermal distortion. In this case, if the backside of the wafer is firmly fixed, thermal stress on the wafer cannot be released and the wafer is subjected to high stress.

This stress causes thermal strain that was suppressed during the implantation process to be released all at once when the wafer is released from the wafer clamp after the high-temperature implantation process. As a result, the wafer may break or bounce off a support base with the wafer clamp.

The related art technology provides no countermeasures to address the above defects. In addition to the above thermal stress, a residual adsorption force should be considered. When an electrostatic chuck is used, a residual adsorption force is generated on the wafer. In this case, a complicated voltage control is required to remove the residual adsorption force when the wafer is released from the wafer clamp. Various embodiments described herein address these disadvantages with the related art technology.

Figure 1:
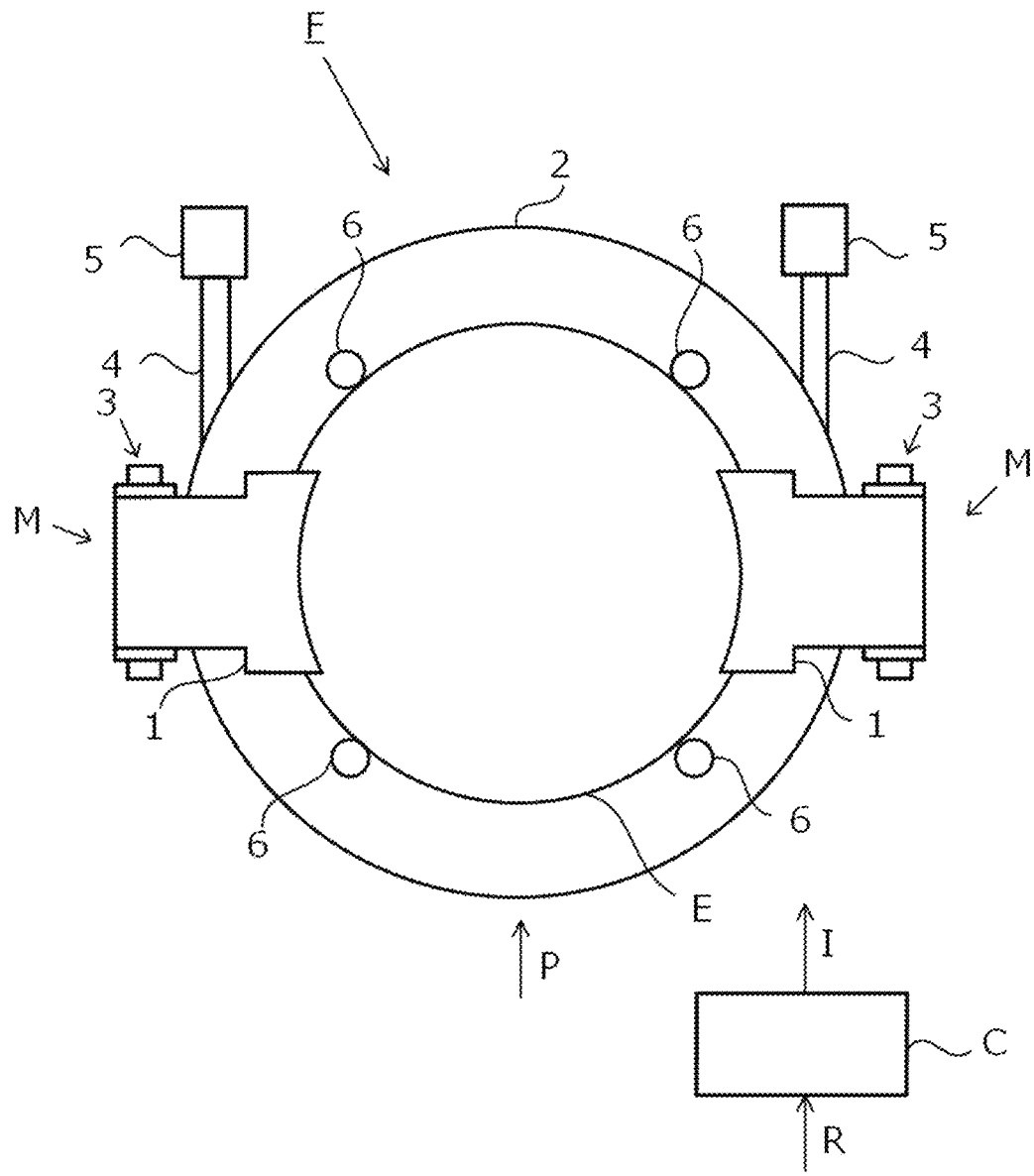
FIG. 1 is a schematic plan view of an example configuration of a wafer clamp, according to some embodiments.
Figure 2:
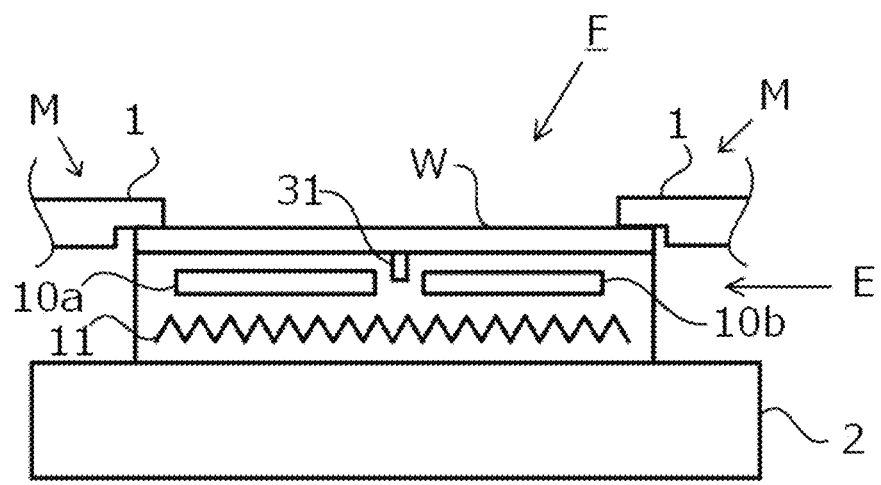
FIG. 2 is a schematic plan view of configuration of the wafer clamp as shown in FIG. 1 from the P direction.

FIG. 1 is a schematic plan view showing an example configuration of a wafer clamp F. FIG. 2 is a schematic plan view from P direction of FIG. 1. For simplification of FIG. 2, regulatory members 6 described later are omitted from FIG. 2.

The wafer clamp F is equipped with a mechanical clamp M and an electrostatic chuck E. The wafer clamp F is used to process a wafer W in semiconductor manufacturing apparatus such as an ion implanter, an ion beam etching apparatus, and/or a deposition apparatus.

In some embodiments, the mechanical clamp M may be a mechanical clamp that does not require a power supply to clamp and release the wafer. FIG. 1 shows a pair of mechanical clamps M that hold right edge and left edge of the wafer. By changing a posture of the wafer clamp F from horizontal to vertical or from vertical to horizontal, a link mechanism 3, a rod 4, and a pushing portion 5 in each of the mechanical clamps M work together to achieve an opening and closing motion of a claw 1 of the mechanical clamp M that holds top edge of the wafer.

In some embodiments, the electrostatic chuck E may be, for example, a bipolar electrostatic chuck with a pair of electrodes $10a$ and $10b$, as illustrated in FIG. 2. The electrostatic chuck E may adsorb the wafer W by a Coulomb force or a Johnson-Rahbek force by applying a DC voltage with different polarity to each electrode $10a$ and $10b$.

In some embodiments, the electrostatic chuck E may be equipped with a heater 11 to heat the wafer W to a processing temperature before performing semiconductor manufacturing process, like an ion implantation process. The processing temperature may be predetermined. However, it is not essential that the electrostatic chuck E be equipped with a heater 11, and in some embodiments, a heating means for heating the wafer W may be provided separately from the electrostatic chuck E. For example, in some embodiments, a heater comprising an LED lamp that can be moved to a position opposite the surface of wafer W may be used to heat the wafer W to the processing temperature.

In some embodiments, the electrostatic chuck E may be equipped with a temperature measuring instrument 31 to measure the temperature of the wafer W during or before a wafer process. In some embodiments, the temperature measuring instrument 31 may be, for example, a thermocouple. In FIG. 2, an example is illustrated in which a temperature of the wafer W is directly measured by the temperature measuring instrument 31, but embodiments are not limited thereto and, in some embodiments, a wafer temperature may be indirectly measured by measuring temperature of other components (e.g., temperature of electrostatic chuck E) that can be correlated with temperature of the wafer W.

A support base 2 may support the electrostatic chuck E. For example, when the wafer clamp F is used in an ion implanter, which is a semiconductor manufacturing device, the support base 2 may be rotated and/or tilted by a drive mechanism to adjust the irradiation angle of an ion beam to a surface of the wafer W.

In some embodiments, a shape of the wafer W may be round. In some embodiments, a plurality of regulatory members 6 may be provided around the electrostatic chuck E that regulate radial movement of the wafer W. In an embodiment, the plurality of regulatory members 6 may be disposed on the support base 2 and may restrict a movement of the wafer W in a radial direction. When the wafer W is placed on the electrostatic chuck E, the regulatory members 6 may contact with the peripheral edge of the wafer W or may be slightly separated from the peripheral edge of the wafer W. In some embodiments, each of the regulatory members 6 may be a rod-shaped and may be a heat-resistant member, for example, made of materials such as glassy carbon, SiC, SiC sintered material, tantalum, etc.

A controller C may include a memory to store data, and processing circuitry to calculate data. In some embodiments, processing circuitry may include a processor, a central processing unit (CPU), a microprocessor, a microcontroller, and/or hardware control logic. In some embodiments, the memory may store processing code and the processor may access the memory and execute the processing code to cause the processor to control each part of the wafer clamp F based on the calculation results and input data. In some embodiments, the hardware control logic may be coded to control each part of the wafer clamp F based on the calculation results and input data. In some embodiments, the controller C may receive recipe information R and may compare the processing temperature of the wafer W contained in the recipe information R with a reference temperature stored in the memory of the controller C. The controller C may then output a command signal I to the wafer clamp F based on the comparison results. In some embodiments, instead of the reference temperature, the controller C may output a command signal I to the wafer clamp F by comparing the processing temperature of the wafer W contained in the recipe information R with a measurement result of a temperature of the wafer W.

Figure 3:
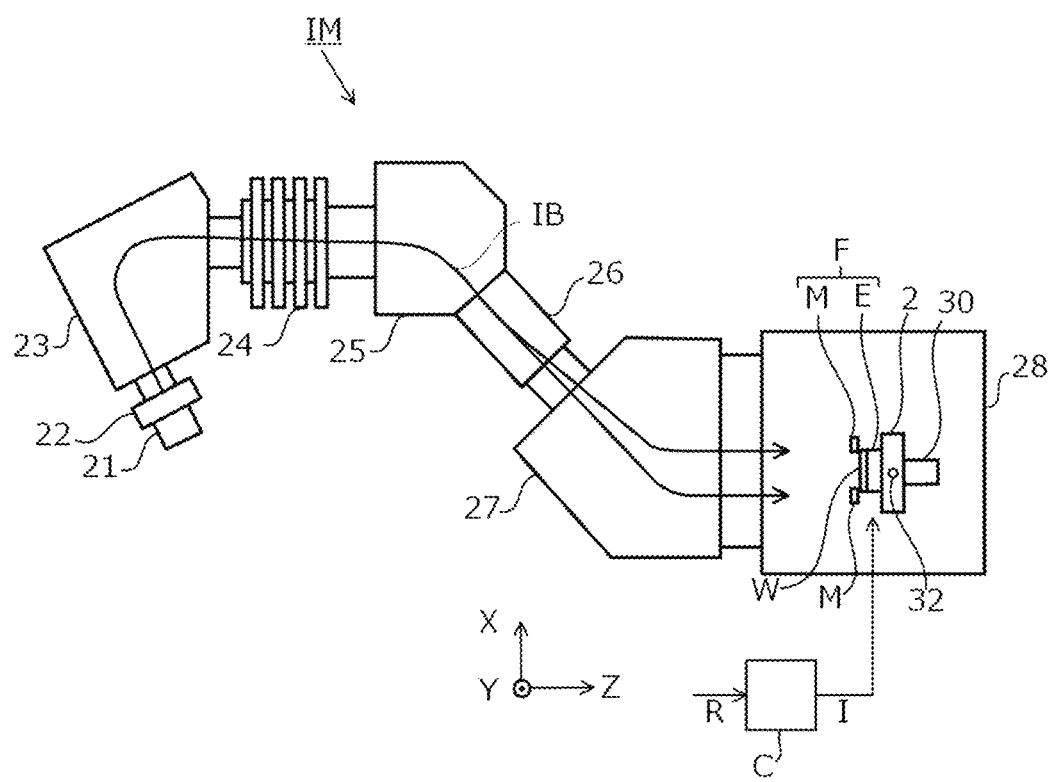
FIG. 3 is a schematic plan view of an example configuration of an ion implanter equipped with a wafer clamp, according to some embodiments.

FIG. 3 is a schematic plan view of an example configuration of an ion implanter IM equipped with a wafer clamp F. A plasma which is a source of an ion beam IB is generated in a plasma chamber 21. The extraction electrode 22 extracts the ion beam IB from the plasma generated in the plasma chamber 21.

The ion beam IB extracted from the extraction electrode 22 contains a plurality of ions. A mass analyzer 23 separates the ions according to their mass in order to select the desired ions from the ion beam IB. An acceleration/deceleration tube 24 accelerates or decelerates the ion beam IB selected by the mass analyzer 23 to convert it into an ion beam IB of the desired energy.

An magnetic energy filter 25 is located at downstream of the acceleration/deceleration tube 24. The magnetic energy filter 25 removes ions with unwanted energy components generated by charge conversion between the mass analyzer 23 and the acceleration/deceleration tube 24 and in the acceleration/deceleration tube 24.

When the ion beam IB is cut in a plane perpendicular to a travel direction of the ion beam IB, the cross section of the ion beam IB extracted from the extraction electrode 22 is elliptical shape. Such an ion beam IB is called a spot beam.

After passing through the magnetic energy filter 25, the ion beam IB is periodically scanned along one direction by the scanner 26 and converted into an ion beam that is apparently wider in the scanning direction.

The scanned ion beam IB enters the collimator 27 and is converted into a parallel ion beam IB with aligned travel direction by magnetic deflection in the collimator 27. The scanning width of the ion beam IB after passing through the collimator 27 is wider than the dimensions of the wafer W in the scanning direction of the ion beam IB. The ion implantation process is carried out by moving the wafer W in the direction parallel to the Y-axis in the FIG. 4 for such an ion beam IB.

A wafer W held in a wafer clamp F may be placed in a process chamber 28. That is, the process chamber 28 may receive a wafer W and the wafer W may be held in place by the wafer clamp F. The support base 2 that supports the wafer clamp F is connected to a drive structure 30. The drive structure 30 rotates and tilts the support base 2, thereby adjusting the irradiation angle of the ion beam IB to the surface of the wafer W.

When the wafer W is received in the wafer clamp F, the drive structure 30 rotates the support base 2 approximately 90 degrees from the posture shown in the FIG. 3. At this time, a surface of the electrostatic chuck E for supporting the wafer W faces upward in FIG. 3. When the electrostatic chuck E is in this posture, the wafer W on the electrostatic chuck E is heated by the heater 11 to bring the temperature of the wafer W to the processing temperature or above the processing temperature.

In some embodiments, a temperature measuring instrument 32 may be provided on the ceiling of the process chamber 28. In some embodiments, the temperature measuring instrument 32 may include, for example, a radiation thermometer or a thermal imaging camera, etc. The temperature measuring instrument 32 is used to measure the temperature of the wafer W on the electrostatic chuck E.

The measurement of wafer temperature can be performed by any means, and the number of such means is not limited. For example, if the electrostatic chuck E is equipped with the temperature measuring instrument 31, the temperature measuring instrument 32 may be omitted from the ceiling of the process chamber 28.

The XYZ axes shown in FIG. 3 are drawn with respect to an ideal trajectory of the ion beam IB entering the process chamber 28. The Z axis is parallel to the travel direction of the ion beam IB; the X and Y axes are mutually orthogonal to the Z axis. The travel direction of the ion beam IB varies according to the position of the ion beam IB. In ion implanter IM, the scanning direction of the ion beam IB at the scanner 26 is parallel to the X axis.

The controller C may control each part of the ion implanter IM. For example, in some embodiments, the memory of the controller may store implantation control code and the processor may access the memory and execute the implantation control code to cause the processor to control each part of the ion implanter IM. In some embodiments, the hardware control logic may be coded to control each part of the ion implanter IM.

Figure 4:
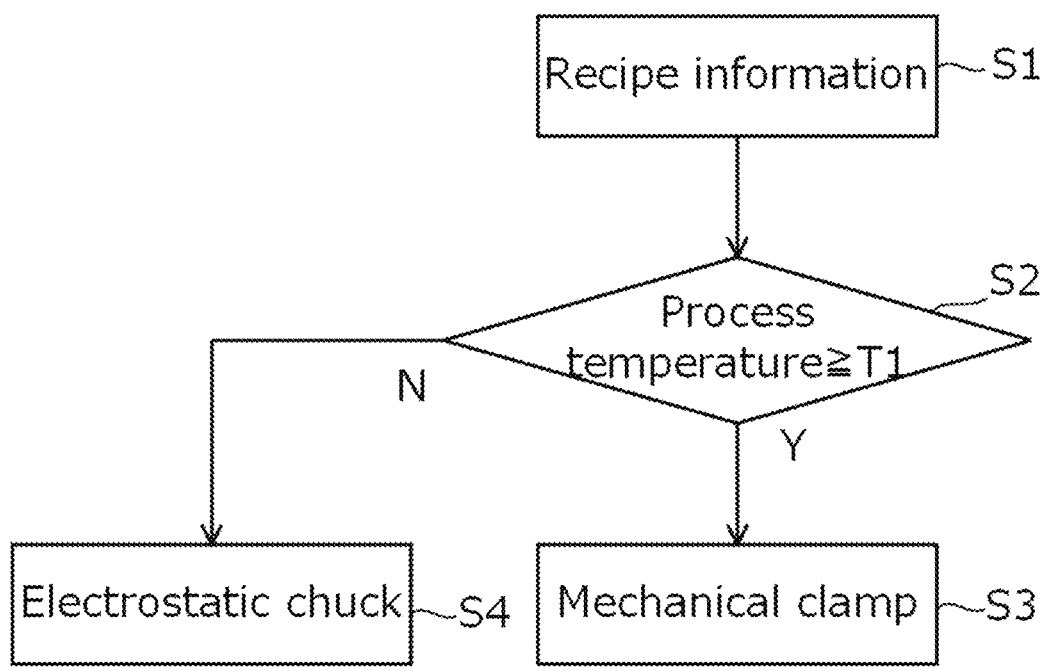
FIG. 4-7 illustrate flowcharts showing examples of a wafer clamping method, according to various embodiments.

FIG. 4 is a flowchart showing an example of a wafer clamping method implemented by the controller C in FIGS. 1 through 3.

The recipe information R is input to the controller C (process S1). Next, the processing temperature of the wafer W contained in the recipe information R is compared with a first reference temperature T1, which is higher than room temperature (for example, room temperature may be about 25° C.) stored in the controller C (process S2). For example, in some embodiments, the first reference temperature T1 may be about 300° C. In some embodiments, the first reference temperature T1 may be about 500° C. If the processing temperature is greater than or equal to the first reference temperature T1 (process S2, Y), the wafer W is clamped by using only the mechanical clamp M (process S3). Conversely, if the processing temperature is below the first reference temperature T1 (process S2, N), then the electrostatic chuck E is used to clamp the wafer W (process S4). In some embodiments, a combination of the electrostatic chuck E and the mechanical clamp M may be used to clamp the wafer W in process S4.

In general, the higher the processing temperature of the wafer W, the greater the thermal deformation of the wafer W. If the wafer W is clamped so firmly that the thermal deformation of the wafers W is almost unacceptable, the stress released when the wafer W is declamped increases, and defects such as cracking and rebounding of the wafer W often occur.

A mechanical clamp used in semiconductor manufacturing apparatus does not cover an entire wafer surface to be processed. Rather, the mechanical clamp may hold the wafer at an entire peripheral edge, at a part of the wafer W, or near the peripheral edge of the wafer W.

Since the mechanical clamp does not hold the wafer backside as extensively as an electrostatic chuck, thermal deformation of wafer is allowable. In other words, holding the wafer W by the mechanical clamp does not prevent wafer W from being thermally deformed, except in some places where wafer is held by the mechanical clamp.

In the flowchart in FIG. 4, only the mechanical clamp M is used to hold the wafer W in the high temperature range where the amount of thermal deformation of the wafer W is relatively large. This configuration and operation reduces the stress released during wafer detachment, thereby reducing defects due to stress release that occurs during wafer detachment. Since only mechanical clamp M is used, there is no need for complex voltage control to remove a residual adsorption force that occurs when an electrostatic chuck is used.

On the other hand, in order to perform a semiconductor manufacturing process with high precision, holding the wafer W should be done firmly. Therefore, in the case in which the processing temperature is below the first reference temperature T1, an electrostatic chuck E is used to hold the wafer W. In some embodiments, the mechanical clamp M may be used together with the electrostatic chuck E.

The use of electrostatic chuck E causes residual adsorption force problems, but if the processing temperature is below the first reference temperature T1, the amount of thermal deformation of wafer W is small, and the stress released during declamping the wafer W is small. Therefore, control during declamping the wafer W is simplified because the control can focus on only eliminating the residual adsorption force.

Figure 5:
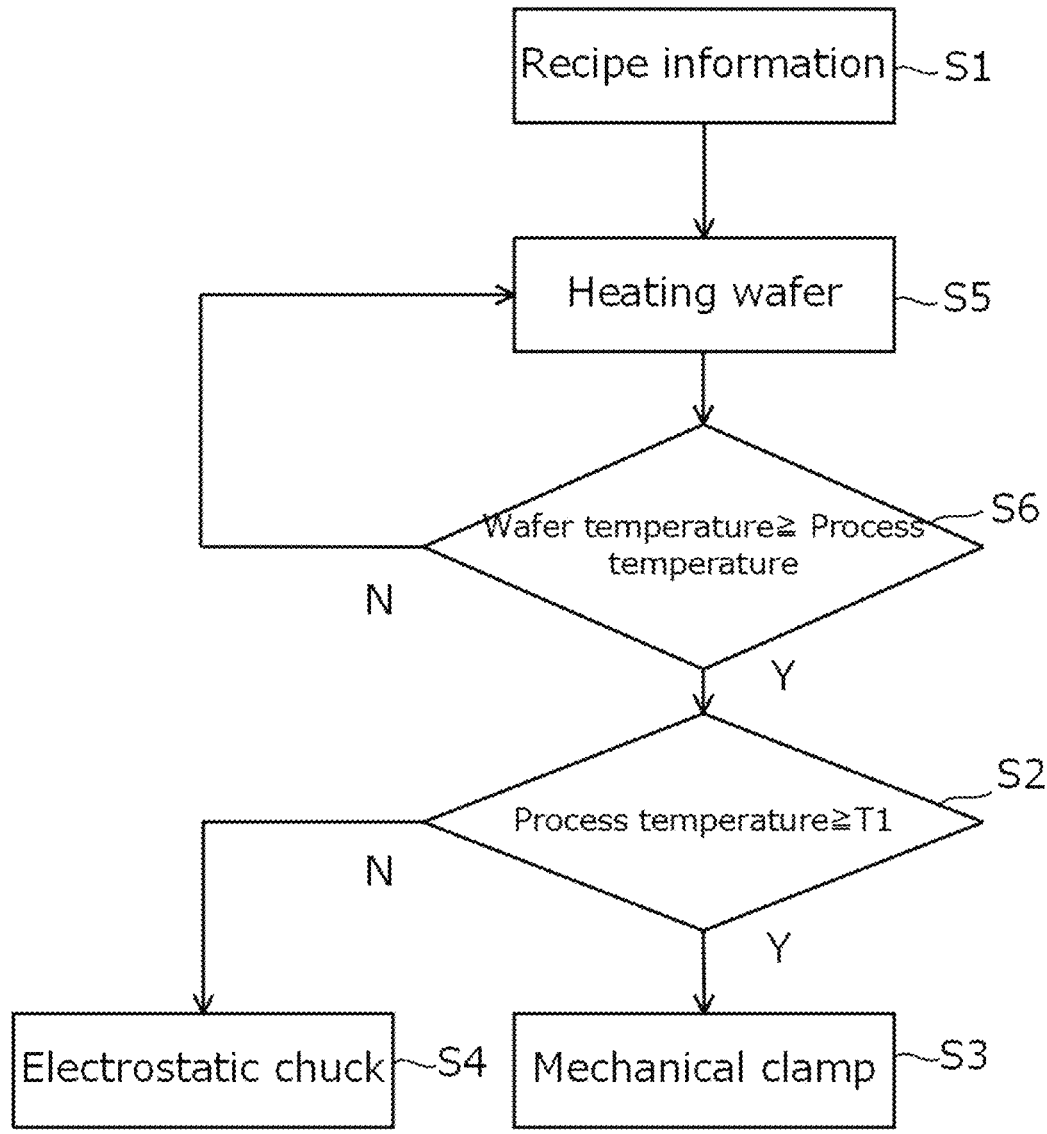

FIG. 5 is a flowchart showing an example of wafer clamping method. In FIG. 5, the same process as in the flowchart in FIG. 4 is indicated with the same symbol, and a detailed explanation is omitted for conciseness. The same applies to the following flowcharts.

The flowchart in FIG. 5 has process S5 and process S6 added to the flowchart in FIG. 4. Specifically, the process S5 and the process S6 are added after the process S1 and before the process S2. After placing the wafer W on the electrostatic chuck E, the wafer W is heated (process S5) before clamping the wafer W. After heating the wafer W, the temperature of the wafer W is measured and the measurement results are compared with the processing temperature obtained from the recipe information R to determine if the measured wafer temperature is greater than or equal to the processing temperature (process S6). If the temperature of the wafer W is greater than or equal to the processing temperature (process S6, Y), the process proceeds to process S2. Conversely, if the temperature of the wafer W is below the processing temperature (process S6, N), the process returns to process S5 and heating of the wafer W is continued.

When the wafer W is heated to the processing temperature after the wafer W is clamped, a large stress is generated in the wafer W. In particular, if the wafer W is warped, the amount of thermal deformation caused by heating of the wafer W is large, and the stress at declamping the wafer W is very large.

To reduce occurrence of such stress, the thermal deformation of the wafer W is intentionally encouraged by heating the wafer W before clamping the wafer W, and the wafer W is clamped after the thermal deformation is reduced.

Heating of the wafer W described above is performed on the wafer clamp F. However, this is only an example and, in some embodiments, the wafer W may be heated at a location other than on the wafer clamp F. If the temperature of the wafer W is eventually heated above the processing temperature on the wafer clamp F, preliminary heating may be performed before the wafer W is transferred to the wafer clamp F.

A heating position of the wafer is not limited to on the wafer clamp F. The heating position may be changed to the area above the wafer clamp F from on the wafer clamp F. Before the wafer W is delivered to the electrostatic chuck E, the wafer W may transported above the electrostatic chuck E on the wafer clamp F while being gripped by a transfer arm of a transfer robot. In this state, the temperature of the wafer W may be heated above the processing temperature. The reason that the wafer W may be heated at this position is that even if the wafer W is heated, the temperature of the wafer W hardly changes because of the close distance between the heating position of the wafer W and the electrostatic chuck E.

Figure 6:
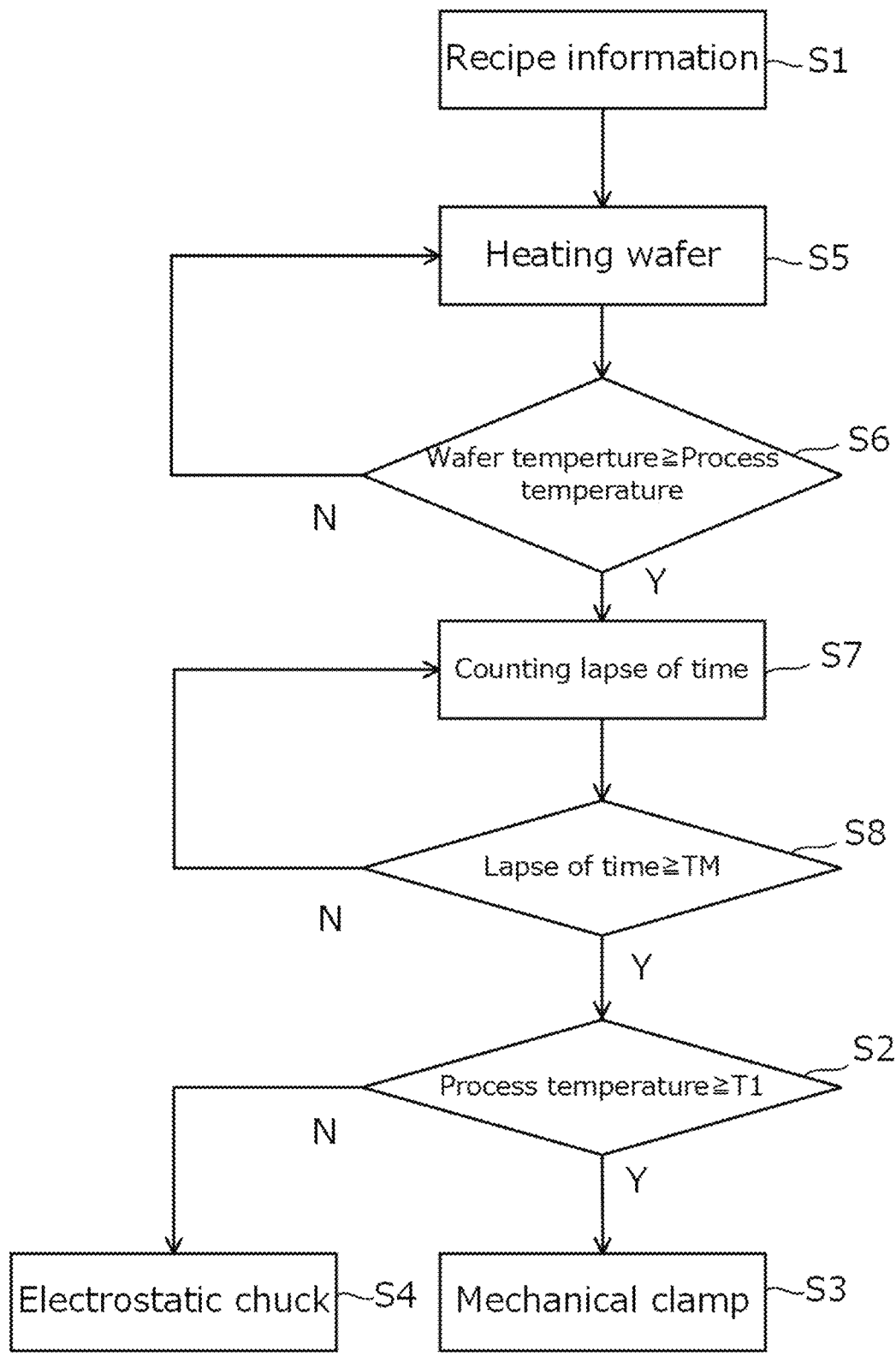

FIG. 6 is a flowchart showing an example of the wafer clamping method. In FIG. 6, a process S7 and a process S8 are added between the process S6 and the process S2. After the temperature of the wafer W becomes greater than or equal to the processing temperature in process S6, an elapsed time is counted (process S7). The elapsed time is then compared with a threshold time (TM) to determine whether the elapsed time is greater than or equal to the threshold time (TM) (process S8). After the elapsed time becomes greater than or equal to the threshold time (process S8, Y), the process proceeds to process S2.

In an embodiment, the threshold time TM may be the time it takes for the amount of thermal deformation of the wafer W to become sufficiently small, and is determined in advance by experiment or by other means. The threshold time TM may be stored in the memory of the controller C in advance, and the threshold time may be changed. In some embodiments, a data table may be provided for each type of wafer W and processing temperature, and the threshold time may be switched according to the recipe information R.

By providing the threshold time TM and sufficiently heating the wafer W, the amount of thermal deformation of the wafer W after wafer fixation can be made smaller. As an additional effect, it is also possible to achieve uniform heat distribution within the wafer surface.

Although some embodiments have been described above with reference to high-temperature processing of the wafer W, cracking and bouncing of the wafer W due to stress release during declamping the wafer W can occur in a similar way in low-temperature processing.

Figure 7:
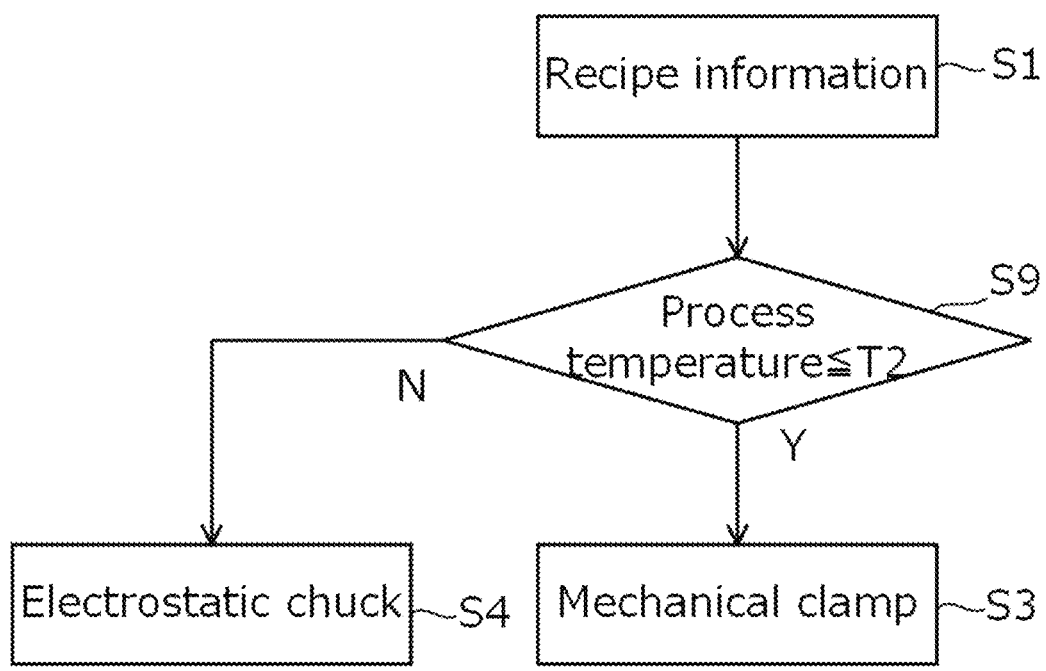

FIG. 7 is a flowchart showing an example of a wafer clamping method in low temperature processing. The differences from FIG. 4, which is a flowchart showing an example of the wafer clamping method in high temperature processing, is mainly in process S9. That is, process S2 in FIG. 4 is replaced with process S9.

In process S9, the processing temperature of the wafer W obtained from the recipe information R is compared with a second reference temperature T2, which is lower than the room temperature, to determine whether the processing temperature is less than or equal to the second reference temperature T2. In some embodiment, the second reference temperature T2 may be, for example, about −50° C. From the comparison results, if the processing temperature is less than or equal to the second reference temperature T2 (process S9, Y), fixation of wafer W using only mechanical clamp M is implemented (process S3). Otherwise, if the processing temperature is higher than the second reference temperature T2 (process S9, N), the wafer is clamped with the electrostatic chuck E (process S4).

As with high-temperature processing, when the processing temperature of the wafer W is equal to or below the second reference temperature T2, which is lower than room temperature, only the mechanical clamp M is used to clamp the wafer W, thereby reducing the occurrence of problems at wafer declamping due to stress release.

In some embodiments, the electrostatic chuck E may be equipped with a wafer cooling structure to cool the temperature of the wafer W instead of or in addition to the heater 11. Specific examples of the wafer cooling structure include a flow path for a refrigerant, such as gulden, or a Peltier element.

Figure 8:
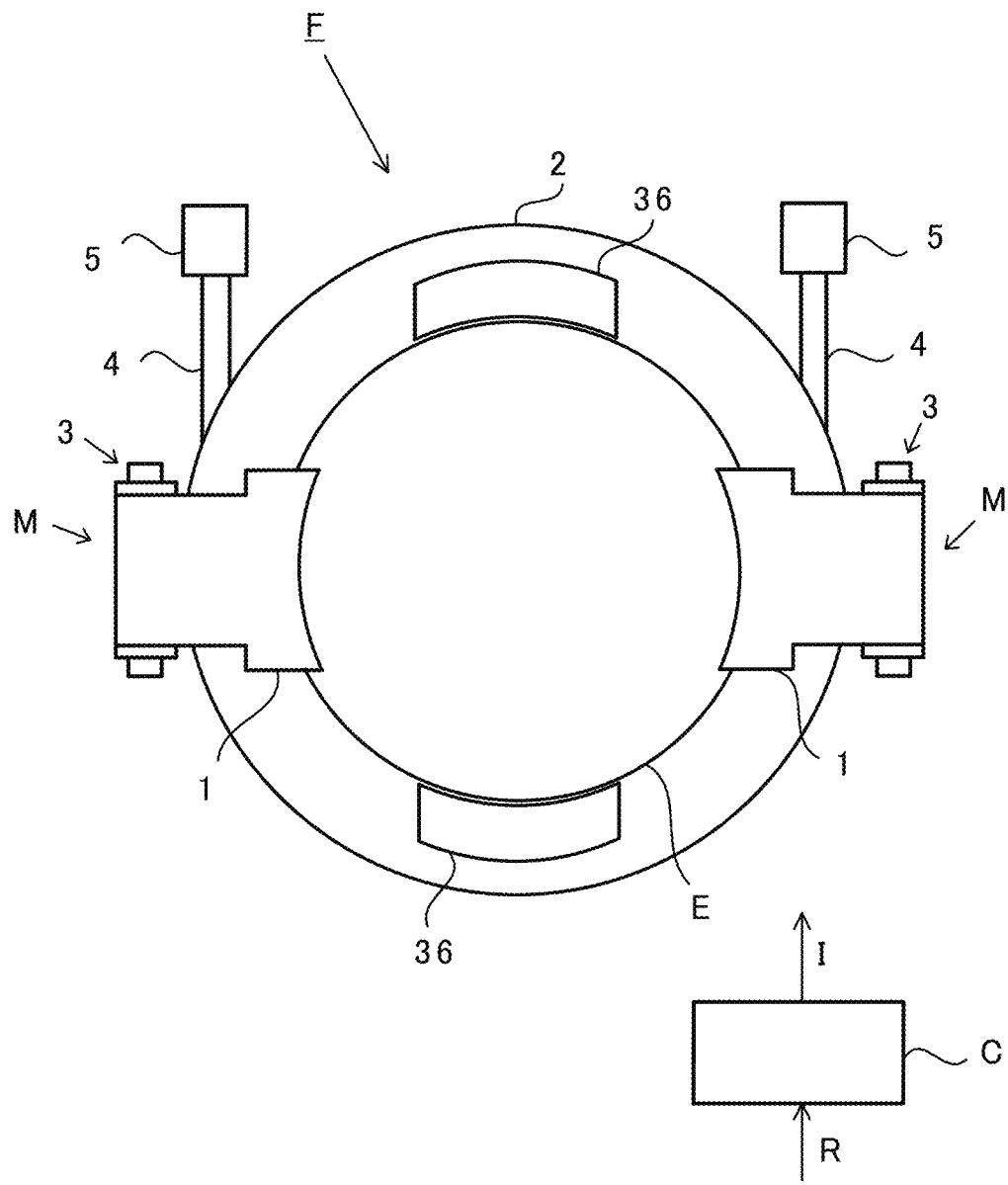
FIG. 8 is a schematic plan view of an example configuration of a wafer clamp, according to some embodiments.

FIG. 8 is a schematic plan view of a configuration of the wafer clamp F, according to some embodiments. The difference from the wafer clamp F shown in FIG. 1 is that instead of a rod-shaped member, a regulatory member 36 made of a wide arc-shaped member is employed. Similar to the embodiment illustrated in FIG. 1, in an embodiment, the regulatory member 36 may be disposed on the support base 2 and may restrict a movement of the wafer W in a radial direction. In some embodiments, the regulatory member may include a plurality of regulatory members 36.

When the tilt angle is set in the ion implantation process, the wafer clamp F is tilted at an angle to the travel direction of the ion beam IB. In this case, the side surface of the electrostatic chuck E is exposed to the ion beam IB, and there is concern that the electrostatic chuck E may fail due to ion beam IB irradiation here.

Therefore, by employing an arc-shaped regulating member 36 along the periphery of the electrostatic chuck E, sputtering of the electrostatic chuck E by the ion beam IB can be prevented.

The height of the regulatory member 36 from the support base 2 (dimension in the backward forward direction (i.e., into and out of the page) of FIG. 8) is higher than the height of the electrostatic chuck E (dimension in the backward forward direction of FIG. 8).

The regulatory member 36 may be provided entirely along the periphery of the electrostatic chuck E, except for the pressing area by the claw 1 of the mechanical clamp M, as long as the regulatory member 36 does not interfere with the delivery of the wafer W.

The tip of the claw 1 of the mechanical clamp M can be a single claw that presses down on the edge of the wafer W. However, to provide elasticity to the tip, the tip can be configured as a multiple-branched part that presses down on the edge of the wafer W. As for the material of the claw 1, glassy carbon, SiC, SiC sintered material, tantalum, etc., which are not easily sputtered and do not scratch the wafer W, may be used.

Figure 9:
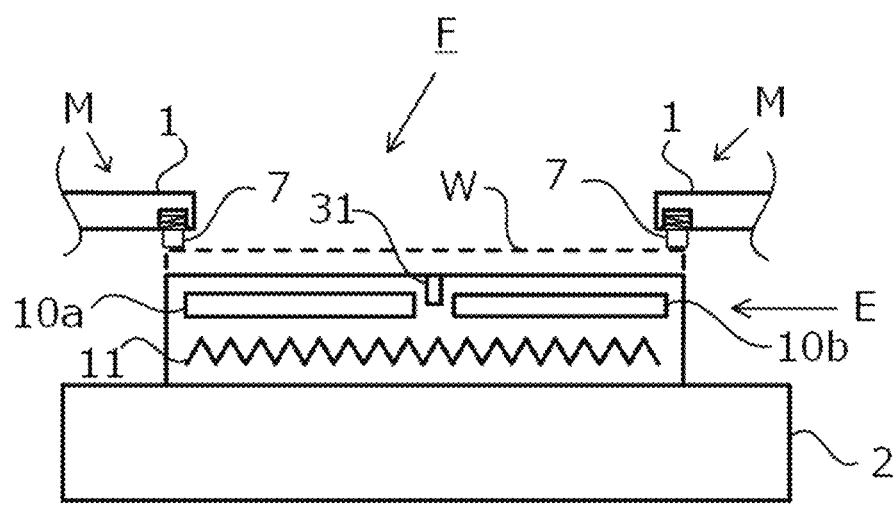
FIG. 9 is a schematic plan view of an example configuration of a wafer clamp, according to some embodiments.

If the material processing is difficult due to the complicated shape of the claw 1, the claw 1 may be composed of multiple materials, and only the tip portion that contacts the wafer W may be composed of a material such as glassy carbon or SiC. To provide further elasticity to the tip of the claw 1, the tip of the claw 1 may be configured with a contacting member 7, to which an elastic member such as a coil spring or plate spring may be attached. Specifically, the configuration is shown in FIG. 9. In some embodiments, the elastic member includes a material with excellent heat resistance, such as austenitic stainless steel, Ni-Base superalloy, or Ni-Co superalloy.

As shown in FIG. 9, by attaching an elastic member to the contacting member 7, the deformation of the wafer W can be sufficiently allowed and the stress on the wafer W can be further reduced. Instead of the configuration shown in FIG. 9, the contacting member 7 itself may be include an elastic member. In this case, the contacting member 7 may be made of a material that does not adhere easily to the wafer W and is heat resistant.

The configuration of the mechanical clamp M in the above embodiments is an example and, in some embodiments, the mechanical clamp M may be configured with a power circuit that realizes the opening and closing motion of the claw 1. Clamping the wafers W by the mechanical clamp M may be implemented in all wafer processing from high to low temperature range.

The pressing site of the wafer W by the mechanical clamp M is not limited to the top surface of the wafer W, but can also be a side surface. Although the electrostatic chuck E in some embodiments adsorbs the wafer W with a bipolar DC voltage, the structure and adsorption method of the electrostatic chuck E are not limited to the configuration described in the above embodiments. For example, an electrostatic chuck that has two or more electrodes and adsorbs the wafer W with AC voltage of two or more phases or an electrostatic chuck that adsorbs the wafer W using gradient force may be employed.

The electrostatic chuck E need not adsorb the entire backside of the wafer W, but in some embodiment may adsorb a portion of the wafer W. If the area of the wafer W adsorbed by electrostatic chuck E is larger than the area of the wafer W clamped by mechanical clamp M, a similar effect of the wafer clamping method may be obtained.

It should be understood that embodiments are not limited to the various embodiments described above, but various other changes and modifications may be made therein without departing from the spirit and scope thereof as set forth in appended claims.

What is claimed is:

1. A wafer clamping method used in a semiconductor manufacturing apparatus including a support base on which a wafer clamp is disposed, the wafer clamp including a mechanical clamp and an electrostatic chuck, the wafer clamping method comprising:
   heating a wafer while the wafer is supported by the support base,
   in response to a processing temperature of the wafer being less than a first reference temperature while the wafer is supported by the support base, clamping the wafer using the electrostatic chuck of the wafer clamp, and
   in response to the processing temperature of the wafer being greater than or equal to the first reference temperature while the wafer is supported by the support base, clamping the wafer using only the mechanical clamp of the wafer clamp.

2. The wafer clamping method according to claim 1, wherein:
   in response to the processing temperature of the wafer being less than the first reference temperature, clamping the wafer using the electrostatic chuck and the mechanical clamp.

3. The wafer clamping method according to claim 1, wherein the first reference temperature is 300° C.

4. The wafer clamping method according to claim 1, wherein the first reference temperature is 500° C.

5. A wafer clamping method used in a semiconductor manufacturing apparatus including a support base on which a wafer clamp is disposed, the wafer clamp including a mechanical clamp and an electrostatic chuck, the wafer clamping method comprising:
   cooling a wafer while the wafer is supported by the support base,
   in response to the processing temperature of the wafer being greater than the second reference temperature while the wafer is supported by the support base, clamping the wafer using the electrostatic chuck, and
   in response to the processing temperature of the wafer being less than or equal to a second reference temperature while the wafer is supported by the support base, clamping the wafer using only the mechanical clamp.

6. The wafer clamping method according to claim 5, wherein:
   in response to the processing temperature of the wafer being greater than the second reference temperature, clamping the wafer using the electrostatic chuck and the mechanical clamp.

7. The wafer clamping method according to claim 5, wherein the second reference temperature is −50° C.

8. A semiconductor manufacturing apparatus comprising:
   a wafer clamp including a mechanical clamp and an electrostatic chuck,
   a support base on which the wafer clamp is disposed,
   a heater, and
   a controller that:
      controls the heater to heat a wafer while the wafer is supported by the support base,
      controls the wafer clamp to, in response to a processing temperature of the wafer being less than a first reference temperature while the wafer is supported by the support base, clamp the wafer using the electrostatic chuck, and
      controls the wafer clamp to, in response to the processing temperature of the wafer being greater than or equal to a first reference temperature while the wafer is supported by the support base, clamp the wafer using only the mechanical clamp.

9. The semiconductor manufacturing apparatus according to claim 8, wherein:
   in response to the processing temperature being less than the first reference temperature, the controller controls the wafer clamp to clamp the wafer using the electrostatic chuck and the mechanical clamp.

10. The semiconductor manufacturing apparatus according to claim 8, wherein:
    the mechanical clamp clamps the wafer at portions of a peripheral edge of the wafer, and
    the semiconductor manufacturing apparatus further comprises a plurality of regulatory members that are disposed on the support base and that restrict a movement of the wafer in a radial direction.

11. The semiconductor manufacturing apparatus according to claim 8, wherein:
    the mechanical clamp clamps the wafer at portions of a peripheral edge of the wafer, and
    the semiconductor manufacturing apparatus further comprises a plurality of regulatory members that are disposed on the support base and that restrict a movement of the wafer in a radial direction.

12. The semiconductor manufacturing apparatus according to claim 8, wherein the first reference temperature is 300° C.

13. The semiconductor manufacturing apparatus according to claim 8, wherein the first reference temperature is 500° C.

14. A semiconductor manufacturing apparatus comprising:
    a wafer clamp including a mechanical clamp and an electrostatic chuck,
    a support base on which the wafer clamp is disposed,
    a cooling structure, and
    a controller that:
       controls the cooling structure to cool a wafer while the wafer is supported by the support base,
       controls the wafer clamp to, in response to a processing temperature of the wafer being greater than the second reference temperature while the wafer is supported by the support base, clamp the wafer using the electrostatic chuck, and
       controls the wafer clamp to, in response to the processing temperature of the wafer being less than or equal to a second reference temperature while the wafer is supported by the support base, clamp the wafer using only the mechanical clamp.

15. The semiconductor manufacturing apparatus according to claim 14, wherein:
    in response to the processing temperature of the wafer being greater than the second reference temperature, the controller controls the wafer clamp to clamp the wafer using the electrostatic chuck and the mechanical clamp.

16. The semiconductor manufacturing apparatus according to claim 14, wherein the second reference temperature is −50° C.

* * * * *